(12) United States Patent
Kim et al.

(10) Patent No.: US 8,058,114 B2
(45) Date of Patent: Nov. 15, 2011

(54) METHOD OF MANUFACTURING THE ARRAY SUBSTRATE CAPABLE OF DECREASING A LINE RESISTANCE

(75) Inventors: Jang-Soo Kim, Gyeonggi-do (KR); Hong-Long Ning, Gyeonggi-do (KR); Bong-Kyun Kim, Incheon (KR); Hong-Sick Park, Gyeonggi-do (KR); Shi-Yul Kim, Gyeonggi-do (KR); Chang-Oh Jeong, Gyeonggi-do (KR); Sang-Gab Kim, Seoul (KR); Jae-Hyoung Youn, Seoul (KR); Woo-Geun Lee, Gyeonggi-do (KR); Yang-Ho Bae, Seoul (KR); Pil-Sang Yun, Seoul (KR); Jong-Hyun Choung, Gyeonggi-do (KR); Sun-Young Hong, Gyeonggi-do (KR); Ki-Won Kim, Gyeonggi-do (KR); Byeong-Jin Lee, Gyeonggi-do (KR); Young-Wook Lee, Gyeonggi-do (KR); Jong-In Kim, Gyeonggi-do (KR); Byeong-Beom Kim, Gyeonggi-do (KR); Nam-Seok Suh, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 10 days.

(21) Appl. No.: 12/797,527

(22) Filed: Jun. 9, 2010

(65) Prior Publication Data

US 2010/0261322 A1    Oct. 14, 2010

Related U.S. Application Data

(62) Division of application No. 12/269,748, filed on Nov. 12, 2008, now Pat. No. 7,759,738.

(30) Foreign Application Priority Data

Nov. 14, 2007  (KR) .................. 10-2007-0115806

(51) Int. Cl.
*H01L 21/84* (2006.01)
*H01L 21/336* (2006.01)

(52) U.S. Cl. . 438/152; 438/155; 438/280; 257/E21.586; 257/E21.409

(58) Field of Classification Search .................. 438/152, 438/155, 280; 257/E21.586, E21.409
See application file for complete search history.

(56) References Cited

U.S. PATENT DOCUMENTS

| 6,351,010 | B1 | 2/2002 | Yamanaka et al. | |
|---|---|---|---|---|
| 7,057,675 | B2 | 6/2006 | Ha | |
| 7,541,212 | B2* | 6/2009 | Oh | 438/48 |
| 2002/0036724 | A1 | 3/2002 | Ha | |
| 2004/0201019 | A1 | 10/2004 | Kim et al. | |
| 2008/0115718 | A1 | 5/2008 | Kim et al. | |
| 2009/0117333 | A1* | 5/2009 | Lee et al. | 428/156 |
| 2009/0159944 | A1* | 6/2009 | Oh | 257/292 |
| 2009/0166635 | A1 | 7/2009 | Kim et al. | |
| 2009/0184324 | A1 | 7/2009 | Oh et al. | |

* cited by examiner

*Primary Examiner* — Ngan Ngo
(74) *Attorney, Agent, or Firm* — Innovation Counsel LLP

(57) ABSTRACT

A gate line includes a first seed layer formed on a base substrate and a first metal layer formed on the first seed layer. A first insulation layer is formed on the base substrate. A second insulation layer is formed on the base substrate. Here, a line trench is formed through the second insulation layer in a direction crossing the gate line. A data line includes a second seed layer formed below the line trench and a second metal layer formed in the line trench. A pixel electrode is formed in a pixel area of the base substrate. Therefore, a trench of a predetermined depth is formed using an insulation layer and a metal layer is formed through a plating method, so that a metal line having a sufficient thickness may be formed.

12 Claims, 15 Drawing Sheets

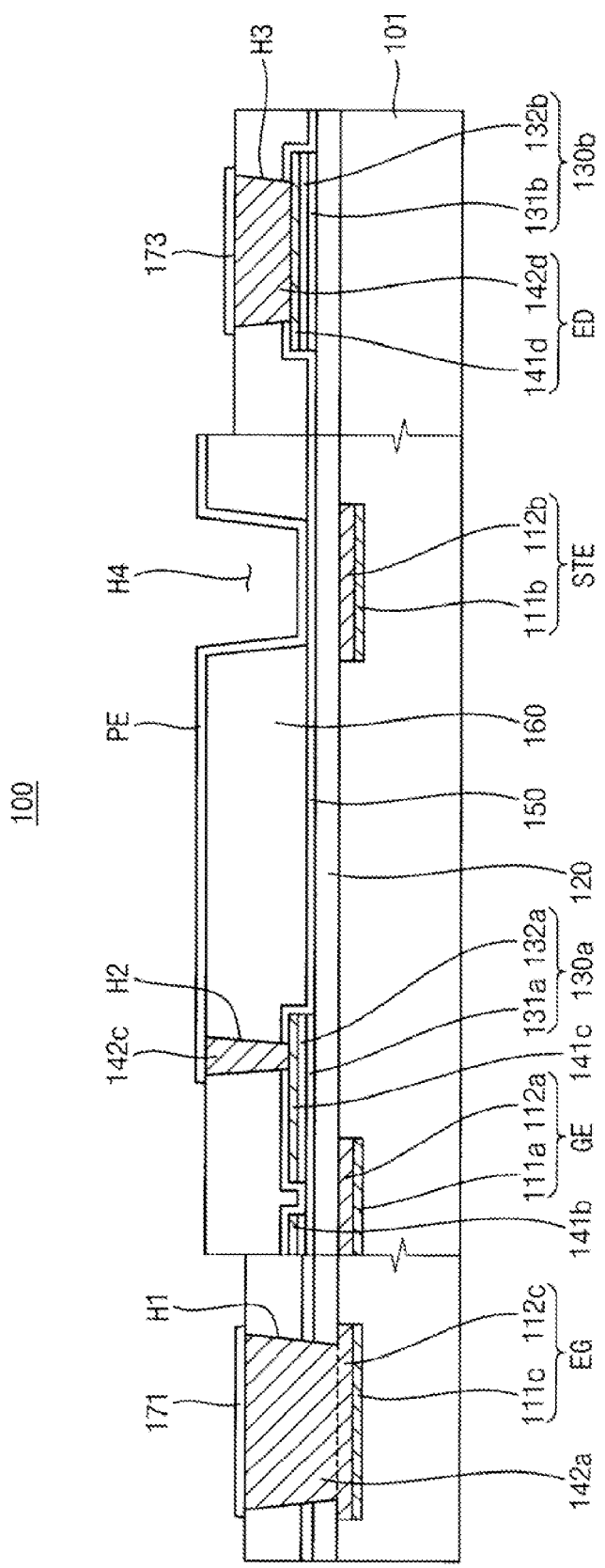

METHOD OF MANUFACTURING THE ARRAY SUBSTRATE CAPABLE OF DECREASING A LINE RESISTANCE

CROSS-REFERENCE TO RELATED APPLICATIONS

This application is a divisional of U.S. patent application Ser. No. 12/269,748 filed on Nov. 12, 2008, which claims priority under 35 U.S.C. §119 to Korean Patent Application No. 10-2007-115806, filed on Nov. 14, 2007 in the Korean Intellectual Property Office (KIPO), the contents of which are herein incorporated by reference in their entirety.

BACKGROUND

1. Technical Field

The present invention relates to an array substrate and a method of manufacturing the array substrate. More particularly, the present invention relates to an array substrate capable of decreasing a line resistance and a method of manufacturing the array substrate.

2. Description of the Related Art

Generally, a liquid crystal display (LCD) device includes an array substrate (or a thin-film transistor (TFT) substrate), an opposite substrate and a liquid crystal layer formed between the array substrate and the opposite substrate. The array substrate includes a plurality of gate lines, a plurality of data lines crossing the gate lines, a switching element electrically connected to the gate lines and the data lines, and a pixel electrode electrically connected to the switching element.

As a display device may have a large-scale size and high resolution, a resistance-capacitance delay that will be referred to hereinafter as RC delay may be increased in a metal line formed on an array substrate. In order to solve the above-mentioned problems, a low resistance metal such as aluminum (Al), copper (Cu), etc., has been used as a metal line such as the gate lines, the data lines, etc.

For example, in a full high definition (HD) screen, to realize a high resolution of no less than about 132 centimeters (i.e., about 52 inches) and a fast frequency of about 120 Hz, it is required that a thickness of an aluminum (Al) line is no less than about 5,000 Å and a thickness of a copper (Cu) line is no less than about 4,000 Å. Moreover, even though the low resistance line is adapted to an array substrate, it is required that a thickness of a line is increased in a geometrical progression.

SUMMARY

Systems and methods are disclosed, in accordance with one or more embodiments, to provide an array substrate capable of forming a line having a sufficient thickness to realize a low resistance line.

Methods are disclosed, in accordance with one or more embodiments, to provide for manufacturing the above-mentioned array substrate.

In one embodiment, an array substrate includes a base substrate, a gate line, a first insulation layer, a second insulation layer, a data line and a pixel electrode. The base substrate has a pixel area. The gate line includes a first seed layer formed on the base substrate and a first metal layer formed on the first seed layer. The first insulation layer is formed on the base substrate having the gate line. The second insulation layer is formed on the base substrate having the first insulation layer. A line trench is formed through the second insulation layer in a direction crossing the gate line. The data line includes a second seed layer formed below the line trench and a second metal layer formed in the line trench. The pixel electrode is formed in the pixel area.

In another embodiment, a method of manufacturing an array substrate capable of forming a line having a sufficient thickness to realize a low resistance line is disclosed. According to a method of manufacturing the array substrate, a gate line is formed on a base substrate using an electroless plating method or an electrolysis plating method. The gate line includes a first metal layer formed on the first seed layer. Then, a first insulation layer is formed on the base substrate having the gate line. Then, a second seed layer is formed on the base substrate having the first insulation layer in a direction crossing the gate line. Then, a second insulation layer is formed on the base substrate having the second seed layer. The second insulation layer has a line trench formed thereon to expose the second seed layer. Then, a second metal layer is formed on the second seed layer of the line trench using the electroless or electrolysis plating method to form a data line including the second seed layer and the second metal layer. Then, a pixel electrode is formed in a pixel area of the base substrate having the data line.

According to an array substrate and a method of manufacturing the array substrate, a trench of a predetermined depth is formed using an insulation layer and a metal layer is formed through a plating method, so that a metal line having a sufficient thickness may be formed to have a low resistance.

BRIEF DESCRIPTION OF THE DRAWINGS

The present invention will become readily apparent by reference to the following detailed description when considered in conjunction with the accompanying drawings wherein:

FIG. 2 is a cross-sectional view of the array substrate according to the first embodiment, which is taken along a line I-I' of FIG. 1;

DESCRIPTION OF THE EMBODIMENTS

Figure 1:
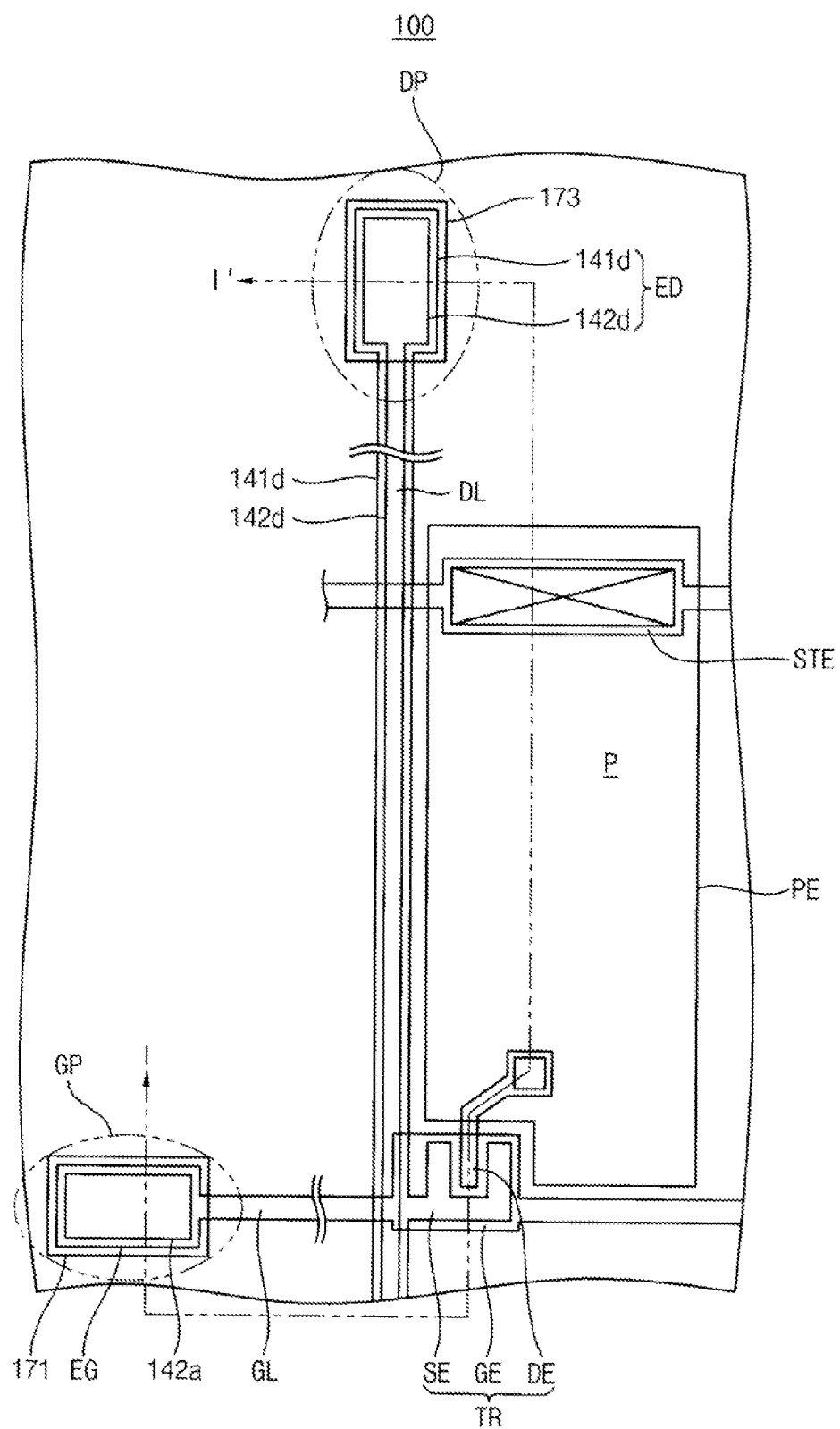
FIG. 1 is a plan view illustrating an array substrate according to a first embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is a plan view illustrating an array substrate according to a first embodiment of the present invention. FIG. 2 is a cross-sectional view of the array substrate according to the first embodiment, which is taken along a line I-I' of FIG. 1.

Referring to FIGS. 1 and 2, an array substrate 100 includes a base substrate 101. The base substrate 101 may include an optically transparent material, for example, a glass substrate. The base substrate 101 includes a display area and a peripheral area surrounding the display area. A plurality of pixel areas P is formed in the display area. A gate pad part GP that provides each of the pixel areas P with a gate signal and a data pad part DP that provides each of the pixel areas P with a data signal are formed in each of the pixel areas P.

A switching element TR, a pixel electrode PE and a storage electrode STE are formed in each pixel area P. The switching element TR is electrically connected to a gate line GL and a data line DL that cross each other. The pixel electrode PE is electrically connected to the switching element TR. The storage electrode STE is overlapped with the pixel electrode PE to define a storage capacitor. The gate pad part GP includes an edge portion of the gate line GL, which will be referred to as a gate edge portion 'EG', a second metal layer 142a and a gate pad electrode 171. The data pad part DP includes an edge portion of the data line DL, which will be referred to as a data edge portion 'ED', and a data pad electrode 173.

The switching element TR includes a gate electrode GE, a source electrode SE and a drain electrode DE. The gate electrode GE is electrically connected to the gate line GL. The source electrode SE is electrically connected to the data line DL. The drain electrode DE is spaced apart from the source electrode SE to electrically contact with the source electrode SE through a channel part 130.

The gate line GL, the gate edge portion EG, the gate electrode GE and the storage electrode STE may be a first metal pattern formed from a same material. The first metal pattern includes first metal layers 112a, 112b and 112c that are plated using an electroless plating method or an electrolysis plating method on patterned first seed layers 111a, 111b and 111c. For example, the gate line GL and the first gate electrode GE protruded from the gate line GL include the first seed layer 111a and the first metal layer 112a formed on the first seed layer 111a. The storage electrode STE includes the first seed layer 111b and the second metal layer 112b. The gate edge portion EG includes the first seed layer 111c and the first metal layer 112c. For example, when the first metal pattern has a thickness of no less than about 1 μm, a line resistance may be reduced.

A first insulation layer 120 that will be referred to as a gate insulation layer hereinafter is formed on the first metal pattern. The gate insulation layer 120 may have a double-layer structure or a single-layer structure. When the gate insulation layer 120 has the double-layer structure, the gate insulation layer 120 includes a low permittivity (low-k) insulation layer, and a silicon nitride layer. When the gate insulation layer 120 has the single-layer structure, the gate insulation layer 120 includes a silicon nitride layer or a silicon oxide layer. For example, a gate insulation layer 120 including the low permittivity insulation layer is formed on the gate line GL and the gate edge portion EG, and a gate insulation layer 120 including the silicon nitride layer or the silicon oxide layer is formed on the gate electrode GE and the storage electrode STE. The low permittivity insulation layer is formed on the gate line GL and the gate edge portion EG, thereby decreasing a line capacitance in proportion to a permittivity.

The source electrode SE and the drain electrode DE may be formed from the second seed layers 141b and 141c. Alternatively, the source electrode SE and the drain electrode DE may include a second metal layer that is plated on the second seed layers 141b and 141c. The channel part 130a is formed below the source and drain electrodes SE and DE. The channel part 130a includes a semiconductor layer 131a and an ohmic contact layer 132a formed on the semiconductor layer 131a. The semiconductor layer 131a includes an amorphous-silicon. The ohmic contact layer 132a includes an amorphous-silicon doped with n+ ion at a high concentration.

The data line DL and the data edge portion ED include a second seed layer 141d and a second metal layer 142d plated on the second seed layer 141d. A channel pattern 130b may be formed below the second seed layer 141d. The channel pattern 130b includes a semiconductor layer 131b and an ohmic contact layer 132b formed on the semiconductor layer 131b. The semiconductor layer 131b includes an amorphous-silicon. The ohmic contact layer 132b includes an amorphous-silicon doped with n+ ion at a high concentration.

A second insulation layer 160 is formed on the gate edge portion EG, the data line DL, the data edge portion ED, the source electrode SE and the drain electrode DE. The second insulation layer 160 may include an organic layer. A passivation layer 150 may further formed below the second insulation layer 160. Hereinafter, the second insulation layer 160 is referred to as an "organic layer."

The gate insulation layer 120, the passivation layer 150 and the organic layer 160 in correspondence with the gate edge portion EG are removed to form a gate pad hole H1, and a second metal layer 142a is formed in correspondence with the gate pad hole H1. The second metal layer 142a electrically connects to the gate edge portion EG and the gate pad electrode 171.

The passivation layer 150 and the organic layer 160 in correspondence with the drain electrode DE including the second seed layer 141c are removed to form a contact hole H2, and a second metal layer 142c is formed in correspondence with the contact hole H2. The second metal layer 142c electrically contacts to the drain electrode DE and the pixel electrode PE formed on the organic layer 160. Hereinafter, the source electrode SE is represented by a reference numeral "141b," and the drain electrode DE is represented by a reference numeral "141c."

The passivation layer 150 and the organic layer 160 in correspondence with the data line DL and the data edge portion ED are removed to form a line trench H3 and a data pad hole H3. In this embodiment, since the line trench H3 and the data pad hole H3 are integrally formed, a detail description for the line trench will be represented as well by a detail description for the data pad hole H3.

The second metal layer 142d is formed in correspondence with the data pad hole H3. The second metal layer 142d formed at the data edge portion ED is electrically connected to the data pad electrode 173. The data line DL and the data edge portion ED include the second seed layer 141d and the second metal layer 142d formed on the second seed layer 141d. A thickness of the data line DL and data edge portion ED is substantially identical to a deposition thickness of the passivation layer 150 and the organic layer 160.

A storage hole H4 is formed through the organic layer 160 to expose the storage electrode STE. The pixel electrode PE contacts with the passivation layer 150 formed on the storage electrode STE through the storage hole H4. That is, a thickness of the insulation layer formed between the storage electrode STE and the pixel electrode PE is thinner, so that a size of an area where the storage electrode STE is formed is decreased to enhance an aperture ratio of the array substrate, while still accomplishing a desired storage capacitance.

FIGS. 3A to 7 are cross-sectional views illustrating a method of manufacturing the array substrate of FIG. 2.

Figure 3A:
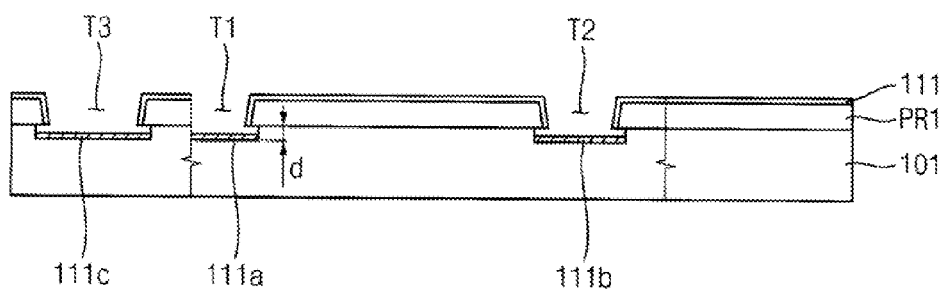
FIGS. 3A to 7 are cross-sectional views illustrating a method of manufacturing the array substrate of FIG. 2.

Referring to FIGS. 1 and 3A, the first photoresist pattern PR1 is formed on the base substrate 101. The first photoresist pattern PR1 may expose an area of the base substrate 101 where the gate electrode GE, the gate line GL, the gate edge portion EG and the storage electrode STE are formed. The base substrate 101 is etched using the first photoresist pattern PR1 to form a plurality of trenches T1, T2 and T3. For example, a depth 'd' of the trenches T1, T2 and T3 may be no less than about 1 μm.

The first seed metal layer 111 is formed on the base substrate 101 having the trenches T1, T2 and T3 formed thereon. The first seed metal layers 111 may include a molybdenum (Mo) series metal such as molybdenum, molybdenum nitride (MoN), molybdenum niobium (MoNb), molybdenum alloy, etc., a copper (Cu) series metal such as copper, copper alloy, copper molybdenum (CuMo) alloy, etc., an aluminum (Al) series metal such as aluminum, aluminum alloy, etc., a silver (Ag) series metal such as silver, silver alloy, etc., and a metal including chromium (Cr), tantalum (Ta), titanium (Ti), tungsten (W), silver (Ag), copper (Cu), an alloy thereof, etc. The first seed metal layer 111 formed on the base substrate 101 is inserted to the trenches T1, T2 and T3, and is formed on the first photoresist pattern PR1.

Figure 3B:
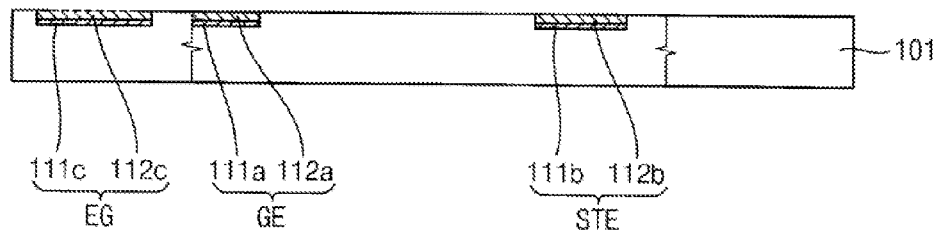

Referring to FIGS. 1 and 3B, the first photoresist pattern PR1 is removed through a strip process to have the first seed layers 111a, 111b and 111c remained in the trenches T1, T2 and T3, respectively. Then, the first metal layers 112a, 112b and 112c are plated on the first seed layers 111a, 111b and 111c formed in the trenches T1, T2 and T3, respectively, using an electroless plating method or an electrolysis plating method. The first metal layers 112a, 112b and 112c may include copper (Cu). The gate electrode GE, the gate line GL, the gate edge portion EG and the storage electrode STE include the first seed layers 111a, 111b and 111c and the first metal layers 112a, 112b and 112c that are plated on the first seed layers 111a, 111b and 111c, respectively.

Figure 4:
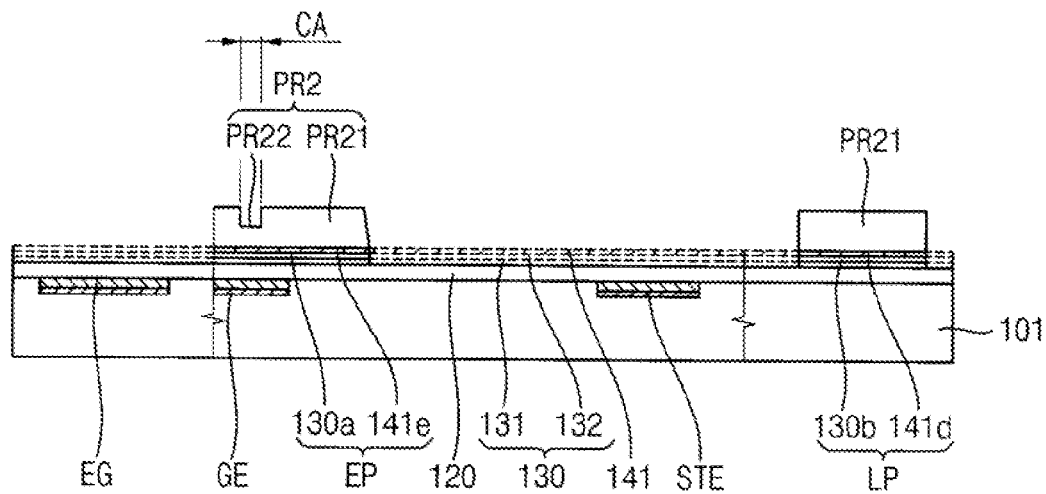

Referring to FIGS. 1 and 4, the gate insulation layer 120 is formed on the base substrate 101 having the first metal pattern including the gate electrode GE, the gate line GL, the gate edge portion EG and the storage electrode STE.

The gate insulation layer 120 may have a double-layer structure or a single-layer structure. When the gate insulation layer 120 has the double-layer structure, the gate insulation layer 120 includes a low permittivity (low-k) insulation layer, and a silicon nitride layer. When the gate insulation layer 120 has the single-layer structure, the gate insulation layer 120 includes a silicon nitride layer or a silicon oxide layer. When the gate insulation layer 120 has a double-layer structure, the low permittivity insulation layer may be removed using an additional mask in correspondence with the switching element TR and the storage electrode STE, in consideration of the turn-on current characteristic of the switching element TR and a capacitance of the storage electrode STE.

A channel layer 130 and a second seed metal layer 141 are sequentially formed on the gate insulation layer 120. The channel layer 130 includes a semiconductor layer 131 and an ohmic contact layer 132 formed on the semiconductor layer 131. The semiconductor layer 131 includes an amorphous-silicon. The ohmic contact layer 132 includes an amorphous-silicon doped with n+ ion at a high concentration.

Then, a second photoresist pattern PR2 is formed on the second seed metal layer 141. The second photoresist pattern PR2 includes a first photo pattern PR21 and a second photo pattern PR22. The first photo pattern PR21 is formed in correspondence with the source electrode SE, the drain electrode DE, the data line DL and the data edge portion ED. The second photo pattern PR22 is formed in correspondence with the channel area CA of the switching element TR. A thickness of the second photo pattern PR22 is thinner than that of the first photo pattern PR21

The channel layer 130 and the second seed metal layer 141 are simultaneously patterned using the second photoresist pattern PR2 to form a second metal pattern. The second metal pattern includes an electrode pattern EP and a line pattern LP. The electrode pattern EP includes a channel part 130a and an electrode layer 141e formed on the channel part 130a. The line pattern LP includes the channel pattern 130b and a second seed layer 141d formed on the channel pattern 130b. The line pattern LP will be formed to the data line DL and the data edge portion ED by the following process.

Figure 5:
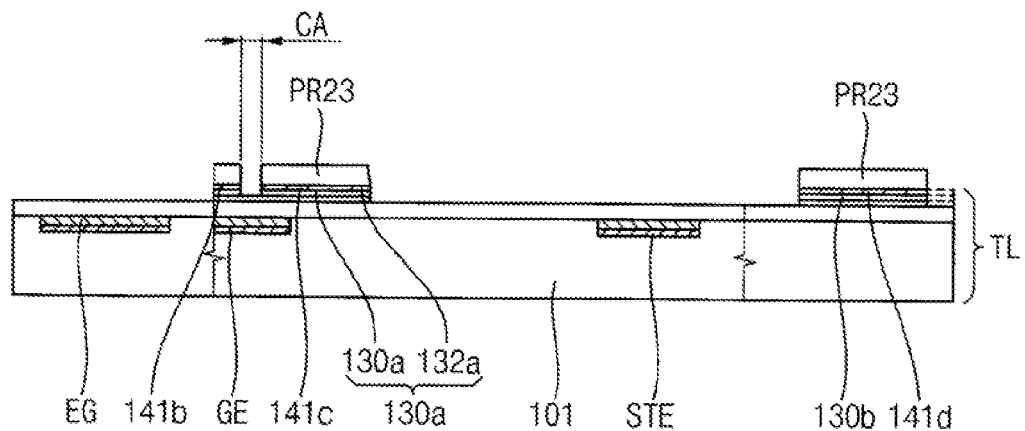

Referring to FIGS. 1 and 5, the second photoresist pattern PR2 is removed by an ashing process to form a third photo pattern PR23. The electrode layer 141e of the channel area CA is patterned using the third photo pattern PR23 to form the source electrode 141b and the drain electrode 141c. Then, the resistance contact layer 132a that is exposed by the source and drain electrodes 141b and 141c is removed to form the channel part 130a of the switching element TR. Then, the third photo pattern PR23 is removed through a strip process.

According to the above, a transistor layer TL is formed on the base substrate 101.

Figure 6:
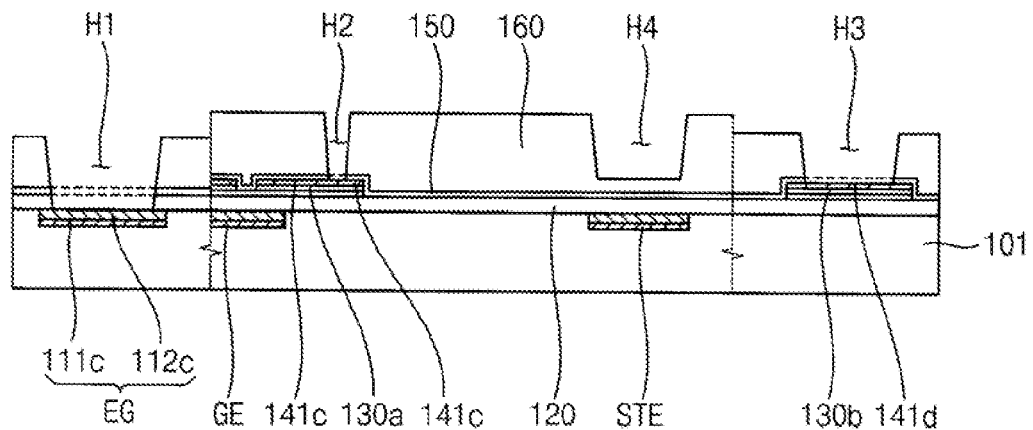

Referring to FIGS. 1 and 6, the passivation layer 150 and the organic layer 160 are formed on the base substrate 101 having the transistor layer TL. Alternatively, the passivation layer 150 may be omitted.

The organic layer 160 is patterned using a mask. The patterned organic layer 160 includes the gate pad hole H1 formed in correspondence with the gate edge portion EG, the contact hole H2 formed in correspondence with the drain electrode 141c, the data pad hole H3 formed in correspondence with the data edge portion ED and the storage hole H4 formed in correspondence with the storage electrode STE.

For example, a thickness of the organic layer 160 in correspondence with the pixel area P is thinner than that of the organic layer 160 in correspondence with the peripheral area where the gate and data pad parts GP and DP are formed. The organic layer 160 of the peripheral area is thinner than that of the pixel area P, thereby decreasing a difference between the gate and data pad parts GP and DP. Therefore, a coupling between the gate and data pad parts GP and DP and a terminal of an external device may be easy.

The gate pad hole H1, the contact hole H2, and the data pad hole H3 expose the passivation layer 150. The organic layer 160 is etched through the storage hole H4 using a slit exposing process to remain at a predetermined thickness.

The passivation layer 150 and the gate insulation layer 120 are etched using the organic layer 160 as a mask. Thus, the gate pad hole H1 exposes the first metal layer 112c of the gate edge portion EG, and the contact hole H2 exposes the drain electrode 141c. The data pad hole H3 exposes the data line DL and the second metal layer 142d of the data edge portion ED.

Figure 7:
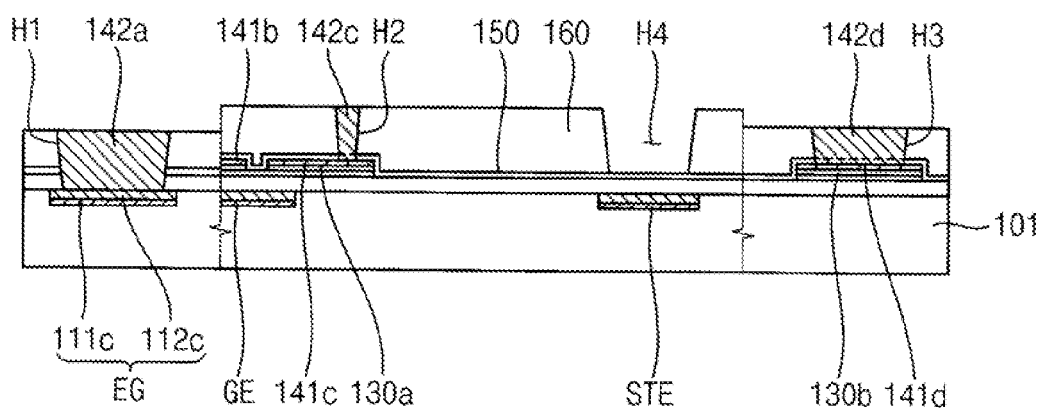

Referring to FIGS. 1, 2 and 7, the organic layer 160 having the gate pad hole H1, the contact hole H2, the data pad hole H3 and the storage hole H4 formed thereon is removed by a predetermined thickness to expose the passivation layer 150 on the storage electrode STE through the storage hole H4. Then, second metal layers 142a, 142c and 142d are formed in correspondence with the gate pad hole H1, the contact hole H2, and the data pad hole H3 using the electroless or electrolysis plating method. The second metal layer 142a is formed in correspondence with the gate pad hole H1 using the first metal layer 112c of the gate edge portion EG as a seed. The second metal layers 142c and 142d are formed in correspondence with the contact hole H2 and the data pad hole H3 using the second seed layers 141c and 141d. A seed material is not in correspondence with the storage hole H4, so that the second metal layer is not formed in the plating process.

Then, a transparent conductive layer is patterned to form a gate pad electrode 171, a pixel electrode PE and a data pad electrode 173. The gate pad electrode 171 is electrically connected to the gate edge portion EG through the second metal layer 142a in correspondence with the gate pad hole H1. The pixel electrode PE is electrically connected to the drain electrode 141c through the second metal layer 142c formed in the contact hole H2. The pixel electrode PE contacts with the passivation layer 150 through the storage hole H4. The data pad electrode 173 contacts with the second metal layer 142d formed in the data pad hole H3. Thus, the data pad electrode 173 is electrically connected to the second metal layer 142d.

Figure 8:
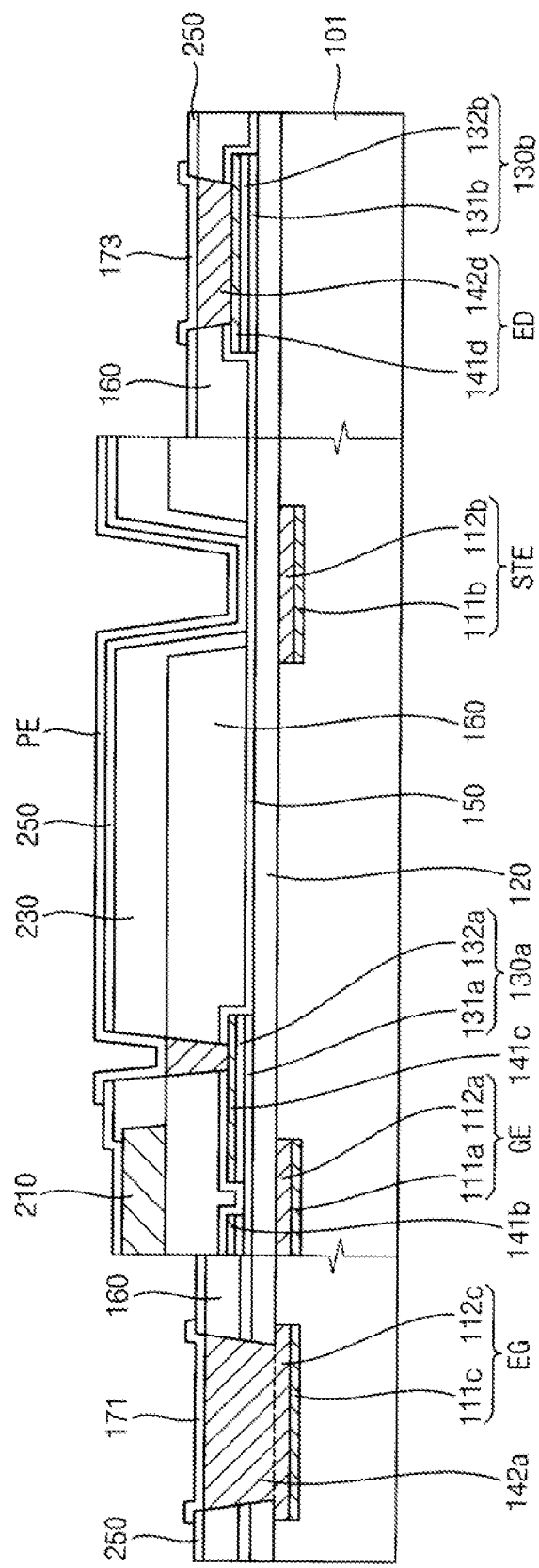
FIG. 8 is a cross-sectional view illustrating an array substrate according to a second embodiment of the present invention.

FIG. 8 is a cross-sectional view illustrating an array substrate according to a second embodiment of the present invention.

Referring to FIGS. 2 and 8, an array substrate further includes a light-blocking layer 210, a color filter layer 230 and a capping layer 250 in comparison to the array substrate of the first embodiment.

The light-blocking layer 210 is formed on the organic layer 160 where the gate line GL, the data line DL and the switching element TR are formed.

The color filter layer 230 is formed in the pixel area P. For example, the color filter layer 230 may be formed between the pixel electrode PE and the organic layer 160. For example, the color filter layer 230 is not formed on the storage electrode STE.

The capping layer 250 is formed on the light-blocking layer 210 and the color filter layer 230 to block leakage materials from the light-blocking layer 210 and the color filter layer 230.

A process of manufacturing the array substrate of the second embodiment as shown in FIG. 8 is substantially same as the process of manufacturing the first metal pattern and the second metal layers 142a, 142c and 142d. Hereinafter, a repeated description for the array substrate will be omitted and the following process for the array substrate will be described in detail.

Figure 9:
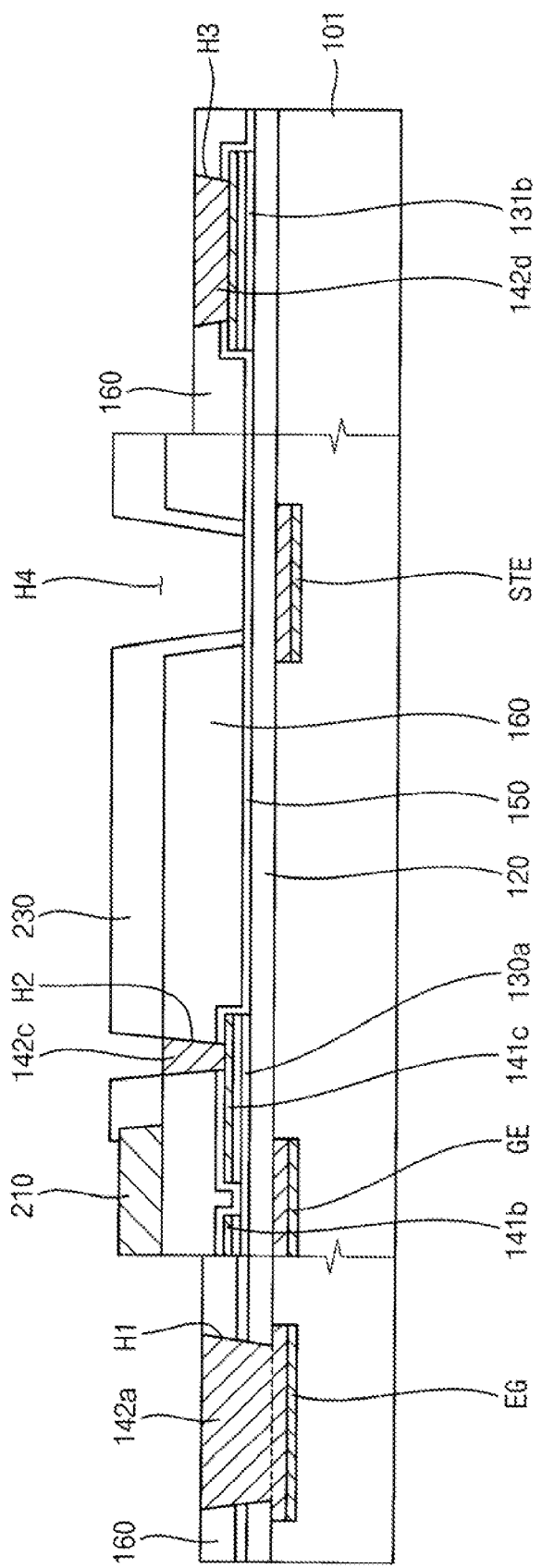
FIGS. 9 and 10 are cross-sectional views illustrating a method of manufacturing the array substrate of FIG. 8.
Figure 10:
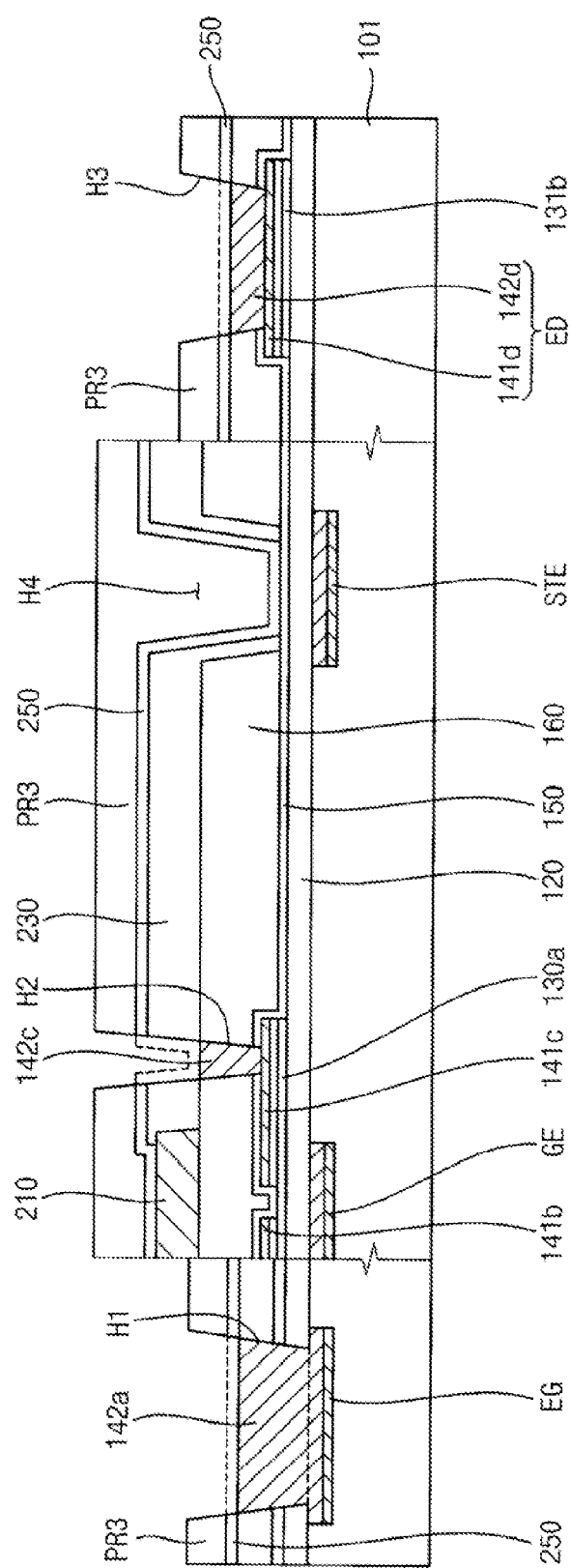

FIGS. 9 and 10 are cross-sectional views illustrating a method of manufacturing the array substrate of FIG. 8.

Referring to FIGS. 1 and 9, the light-blocking material is formed on the base substrate 101 having the second metal layers 142a, 142c and 142d. The light-blocking material is patterned through a mask to form the light-blocking layer 210. The light-blocking layer 210 is formed on the gate line GL, the data line DL and the switching element TR.

A color photoresist material is formed on the base substrate 101 having the light-blocking layer 210. The color photoresist material is patterned using a mask to form the color filter layer 230 in the pixel area P. The color filter layer 230 is not formed in correspondence with the contact hole H2 and the storage hole H4.

Referring to FIGS. 1, 8 and 10, a capping layer 250 is formed on the base substrate 101 having the color filter layer 230. Then, a third photoresist pattern PR3 is formed on the capping layer 250. The third photoresist pattern PR3 exposes the capping layer 250 in correspondence with the first, second and data pad holes H1, H2 and H3.

The capping layer 250 is etched using a fourth photoresist pattern PR4 (not shown) to expose the second metal layer 142a of the gate edge portion EG, the second metal layer 142c over the drain electrode 141c and the second metal layer 142d of the data edge portion ED.

The fourth photoresist pattern PR4 is then removed though a strip process.

Later, a gate pad electrode 171, a pixel electrode PE and a data pad electrode 173 are formed on the base substrate 101.

FIGS. 11 to 14 are cross-sectional view and plan views illustrating a method of manufacturing an array substrate according to a third embodiment of the present invention.

A process of manufacturing the array substrate of the first embodiment as shown in FIGS. 3A to 5 is substantially same as the process of manufacturing the first metal pattern and the transistor layer TL. Hereinafter, a repeated description for the array substrate will be omitted and the following process for the array substrate will be described in detail.

Figure 11:
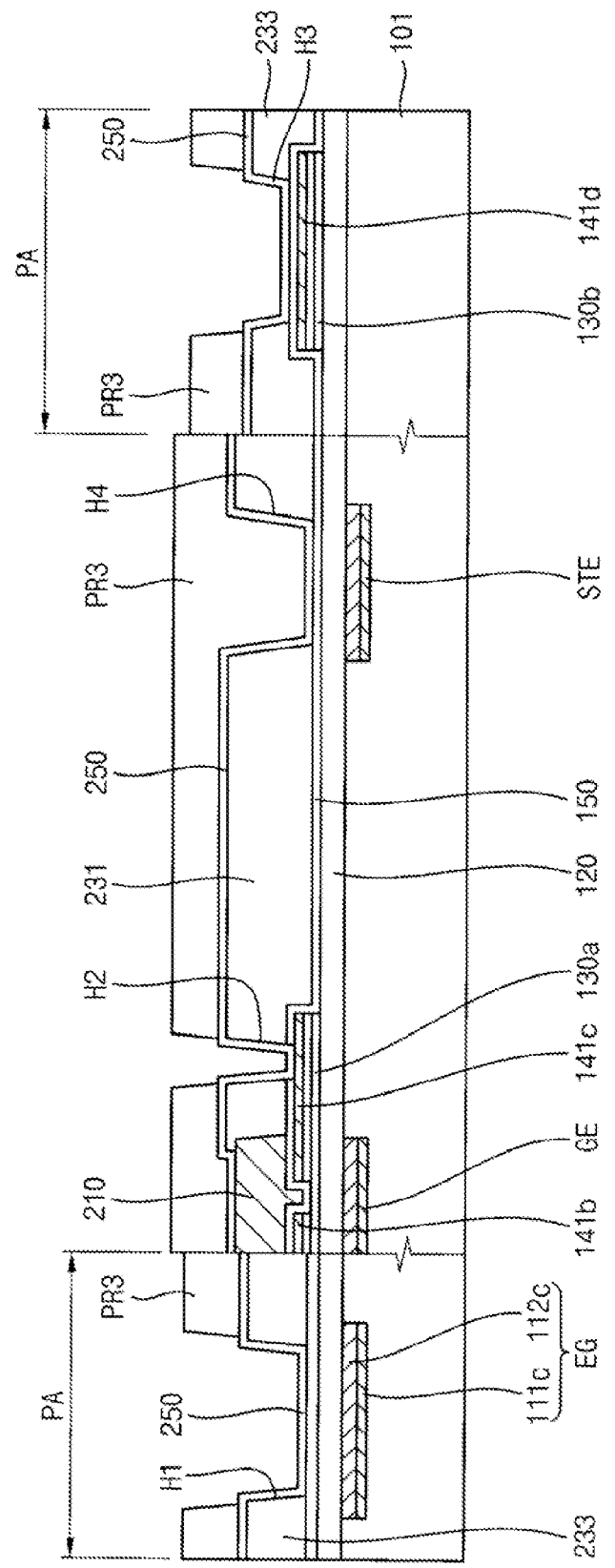
FIGS. 11 to 14 are cross-sectional view and plan views illustrating a method of manufacturing an array substrate according to a third embodiment of the present invention.

Referring to FIGS. 1 and 11, a light-blocking material is formed on the base substrate 101 having the transistor layer TL. The light-blocking material is patterned using a mask to form a light-blocking layer 210. The light-blocking layer 210 is formed on the gate line GL, the data line DL and the switching element TR.

A color filter layer as a second insulation layer is formed on the base substrate 101 having the light-blocking layer 210. For example, a color photoresist material is formed on the base substrate 101 having the light-blocking layer 210. The color photoresist material is patterned using a mask to form a first color filter layer 231 in the pixel area P, and a second color filter layer 233 is formed in a peripheral area PA where the gate pad part GP and the data pad part DP are formed.

Figure 12:
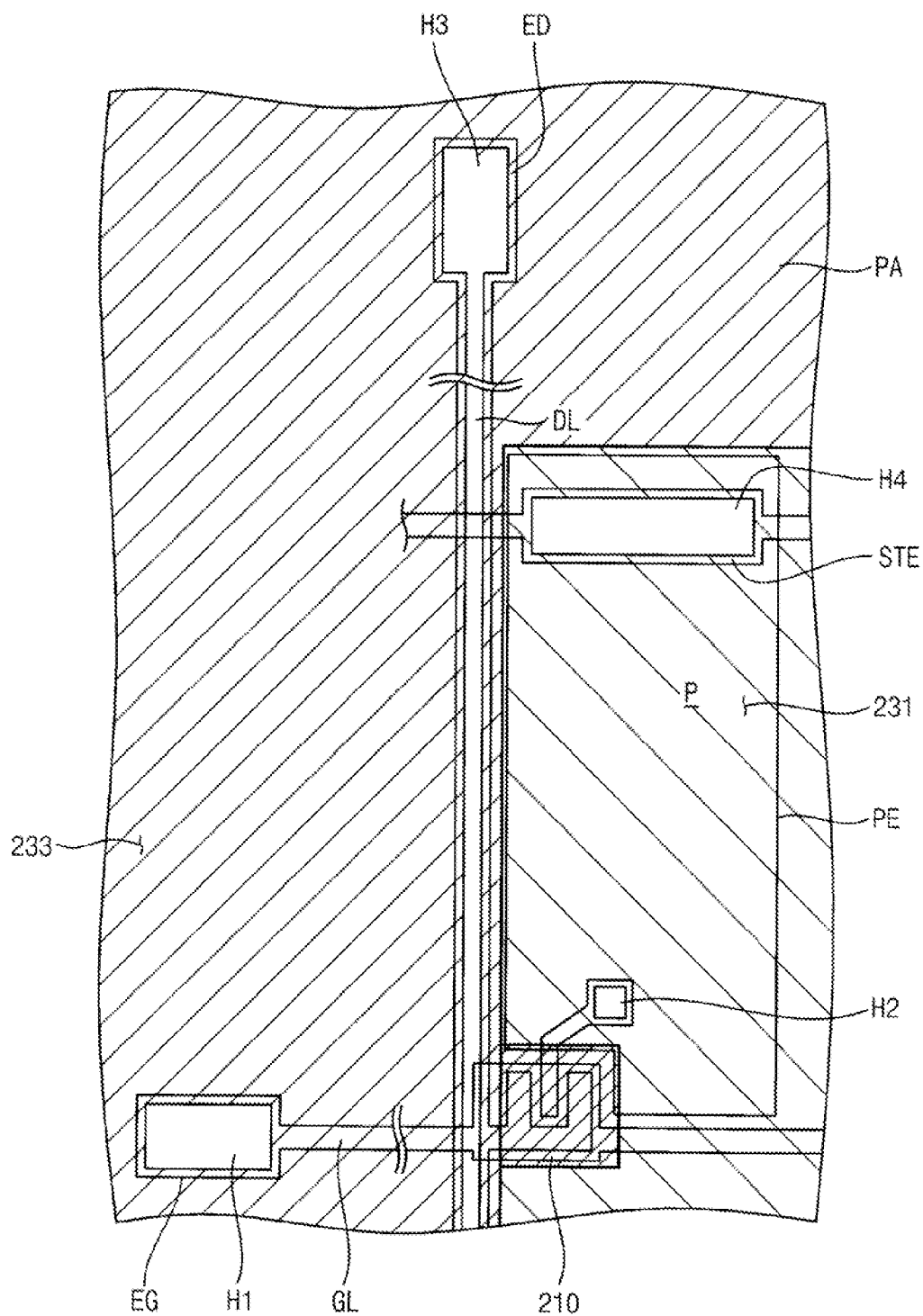

Referring to FIG. 12, a contact hole H2 and a storage hole H4 are formed through the first color filter layer 231. The contact hole H2 exposes the passivation layer 150 in correspondence with the drain electrode 141c. The storage hole H4 exposes the passivation layer 150 in correspondence with the storage electrode STE. A gate pad hole H1 and a data pad hole H3 are formed through the second color filter layer 233. The gate pad hole H1 exposes the passivation layer 150 in correspondence with the gate edge portion EG. The data pad hole H3 exposes the passivation layer 150 in correspondence with the data edge portion ED.

Then, a capping layer 250 is formed on the light-blocking layer 210 and the first and second color filter layers 231 and 233. A third photoresist pattern PR3 is formed on the base substrate 101 having the capping layer 250. The third photoresist pattern PR3 exposes the capping layer 250 in correspondence with the holes H1, H2 and H3.

The capping layer 250 is removed using the third photoresist pattern PR3 as a mask to expose a first metal layer 112c of the gate edge portion EG, the drain electrode 141c and a second seed layer 141d of the data edge portion ED. Then, the third photoresist pattern PR3 is removed through a strip process.

Figure 13:
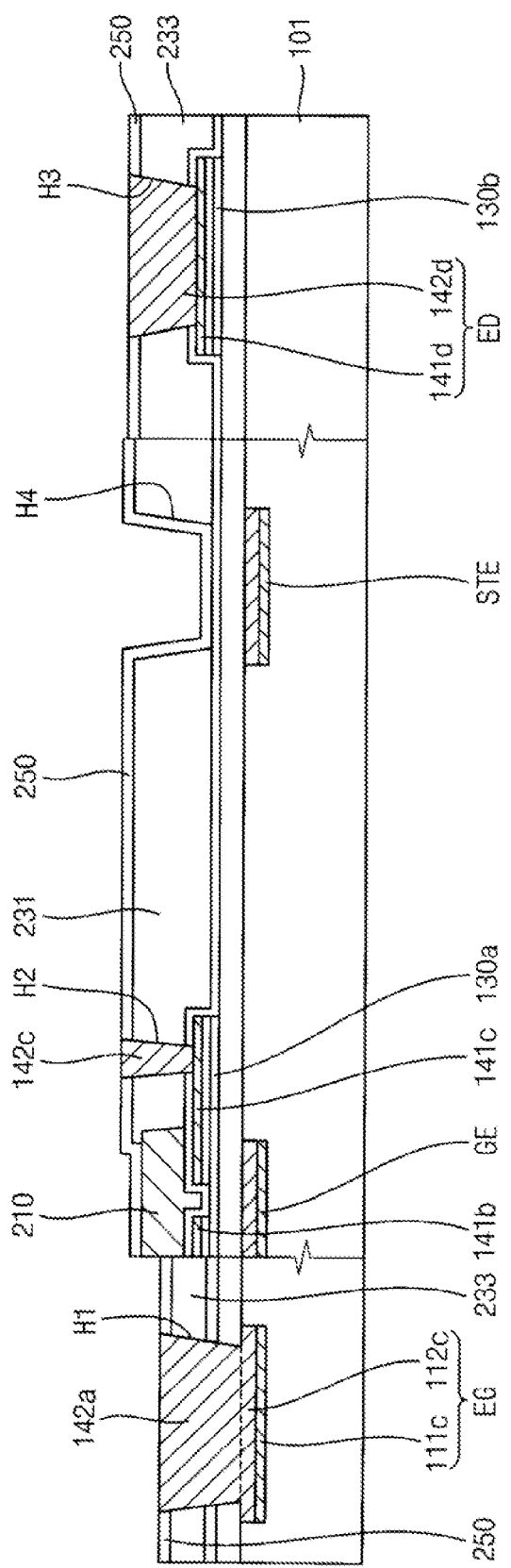

Referring to FIGS. 1 and 13, second metal layers 142a, 142c and 142d are formed on the first metal layer 112c of the gate edge portion EG, the drain electrode 141c and a second seed layer 141d of the data edge portion ED, respectively, using an electroless or electrolysis plating method.

Figure 14:
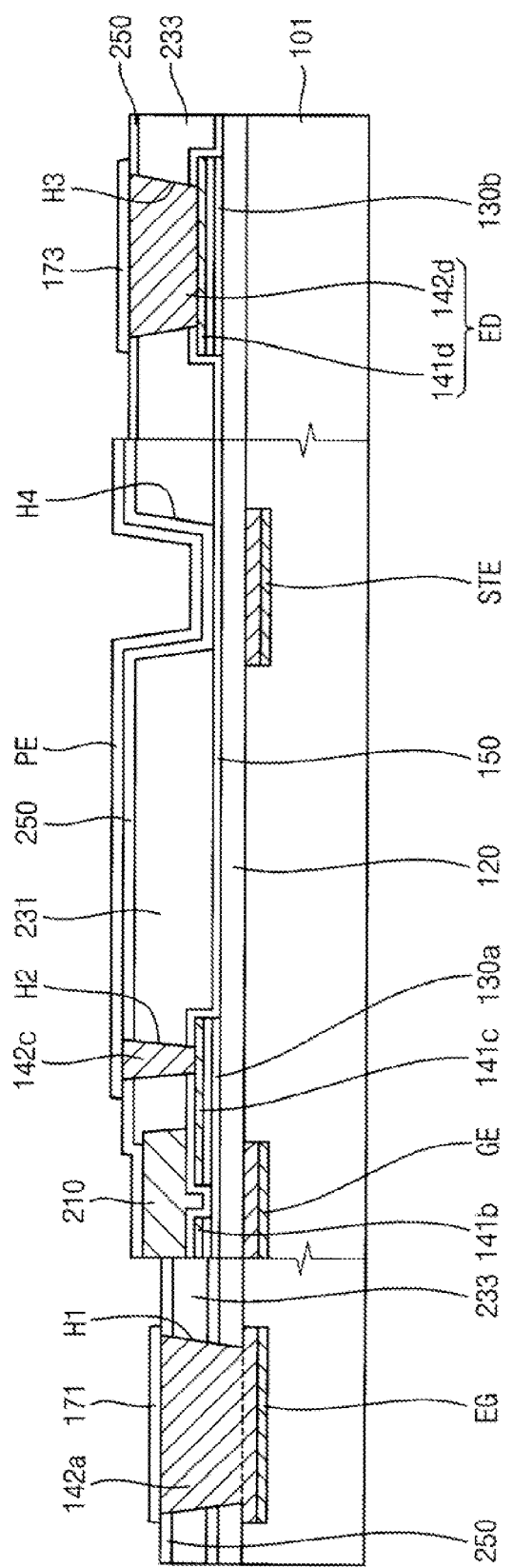

Referring to FIGS. 1 and 14, a gate pad electrode 171, a pixel electrode PE and a data pad electrode 173 are formed on the base substrate 101 having the second metal layers 142a, 142c and 142d. The gate pad electrode 171, the pixel electrode PE and the data pad electrode 173 may include an optically transparent and electrically conductive material.

Alternatively, a light-blocking layer 210 may be formed in the peripheral area PA, and the light-blocking layer 210 may be patterned to form the gate pad hole H1 and the data pad hole H3.

Figure 15A:
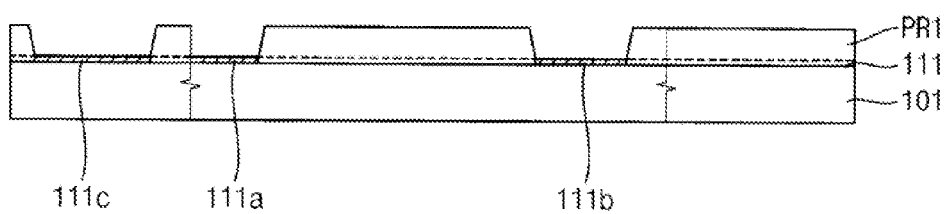
FIGS. 15A to 15C are cross-sectional views illustrating a method of manufacturing an array substrate according to fourth, fifth and sixth embodiments of the present invention.
Figure 15B:
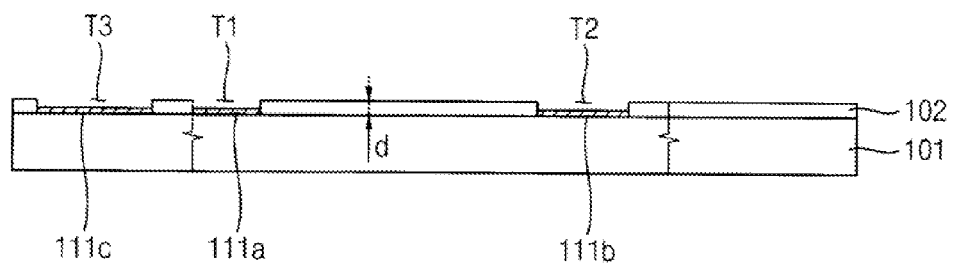
Figure 15C:
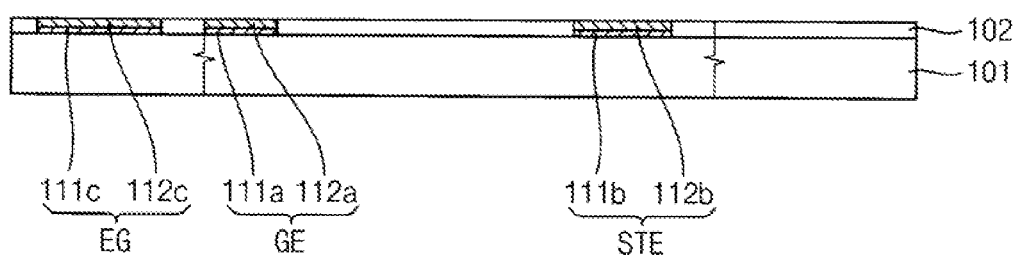

FIGS. 15A to 15C are cross-sectional views illustrating a method of manufacturing an array substrate according to fourth, fifth and sixth embodiments of the present invention. A method of manufacturing an array substrate according to a fourth embodiment will be described with reference to FIGS. 15A and 15C.

Referring to FIGS. 1 and 15A, a first seed metal layer 111 is formed on the base substrate 101. Then, a first photoresist pattern PR1 is formed on the first seed metal layer 111. First seed layers 111a, 111b and 111c remain in an area where the gate electrode GE, the gate line GL, the gate edge portion EG and the storage electrode STE are formed using the first photoresist pattern PR1.

Referring to FIGS. 1 and 15B, an organic pattern 102 is formed on the base substrate 101 having the first seed layers 111a, 111b and 111c. For example, an organic layer is formed on the base substrate 101 having the first seed layers 111a, 111a and 111c, and then the organic layer is patterned to form the organic pattern 102. The organic pattern 102 forms trenches T1, T2 and T3 that are formed in an area where the first seed layers 111a, 111b and 111c are not formed to surround the first seed layers 111a, 111b and 111c. A width 'd' of the organic pattern is no less than about 1 µm. The first seed layers 111a, 111b and 111c are respectively formed through the trenches T1, T2 and T3 that are formed by the organic pattern 102. The organic pattern 102 may include a negative type material, a positive type material and a photoresist material.

Referring to FIGS. 1 and 15C, a first metal layers 112a, 112b and 112c are plated on the first seed layers 111a, 111b and 111c that are formed in the trenches T1, T2 and T3 using an electroless plating method or an electrolysis plating method. The gate electrode GE, the gate line GL, the gate edge portion EG and the storage electrode STE may include the first seed layers 111a, 111b and 111c, and the first metal layers 112a, 112b and 112c.

Then, a following process of the array substrate is substantially same as in the first embodiment as shown in FIGS. 4 to 7, and thus, a detailed description thereof will be omitted.

In the array substrate according to the fifth embodiment of the present invention, a light-blocking layer 210, a color filter layer 230 and a capping layer 250, which are described in the second embodiment as shown in FIGS. 9 and 10, are further formed on the array substrate of the fourth embodiment.

In the array substrate according to the sixth embodiment of the present invention, a transistor layer TL that is described in the first embodiment as shown in FIGS. 4 and 5 is formed on the base substrate having a first metal pattern in accordance with the fourth embodiment. Then, a following process of the array substrate is substantially same as in the third embodiment as shown in FIGS. 11 to 14, and thus, a detailed description thereof will be omitted.

Figure 16A:
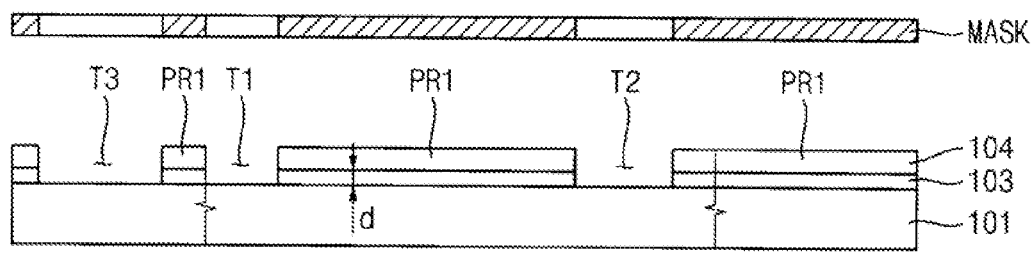
FIGS. 16A and 16C are cross-sectional views illustrating a method of manufacturing an array substrate according to seventh, eighth and ninth embodiments of the present invention.
Figure 16B:
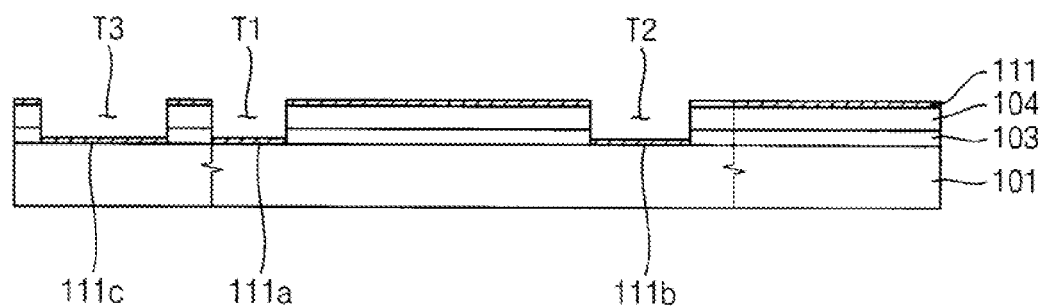
Figure 16C:
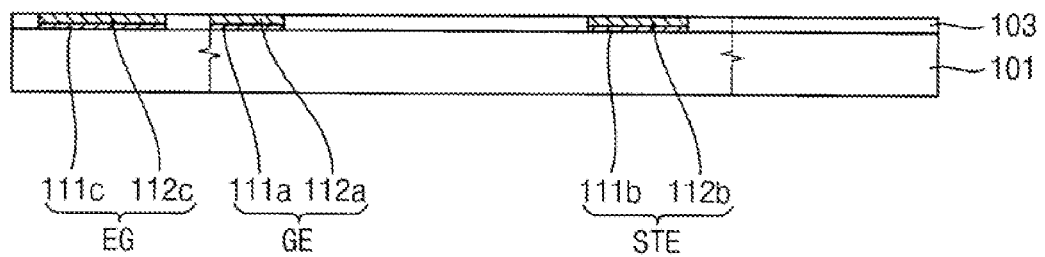

FIGS. 16A to 16C are cross-sectional views illustrating a method of manufacturing an array substrate according to seventh, eighth and ninth embodiments of the present invention. A method of manufacturing the array substrate according to the seventh embodiment will be described with reference to FIGS. 16A and 16B.

Referring to FIGS. 1 and 16A, an organic layer 103 and a photoresist film 104 are sequentially formed on the base substrate 101. A thickness of the organic layer 103 may be no less than about 1 μm. Then, the organic layer 101 and the photoresist film 104 are simultaneously patterned using a mask MASK to form a first photoresist pattern PR1. The first photoresist pattern PR1 may expose the base substrate 101 where the gate electrode GE, the gate line GL, the gate edge portion EG and the storage electrode STE are formed. The first photoresist pattern PR1 may form a plurality of trenches T1, T2 and T3 in the base substrate 101.

Referring to FIGS. 1 and 16B, a first seed metal layer 111 is formed on the base substrate 101 having the first photoresist pattern PR1. The first seed metal layer 111 is inserted to the trenches T1, T2 and T3 on the first photoresist pattern PR1. The first photoresist pattern PR1 is removed through a strip process, so that first seed layers 111a, 111b and 111c remain in the trenches T1, T2 and T3.

Referring to FIGS. 1 and 16C, first metal layers 112a, 112b and 112c are plated on the first seed layers 111a, 111b and 111c having the trenches T1, T2 and T3 formed thereon using the electroless or electrolysis plating method. The gate electrode GE, the gate line GL, the gate edge portion EG and the storage electrode STE may include the first seed layers 111a, 111b and 111c and the first metal layers 112a, 112b and 112c.

Then, a following process of the array substrate is substantially same as in the first embodiment as shown in FIGS. 4 to 7, and thus, a detailed description thereof will be omitted.

In the array substrate according to the eighth embodiment of the present invention, a light-blocking layer 210, a color filter layer 230 and a capping layer 250, which are described in the second embodiment as shown in FIGS. 9 and 10, are further formed on the array substrate of the seventh embodiment.

In the array substrate according to the ninth embodiment of the present invention, a transistor layer TL that is described in the first embodiment as shown in FIGS. 4 and 5, is formed on the base substrate having a first metal pattern in accordance with the seventh embodiment. Then, a following process of the array substrate is substantially same as in the third embodiment as shown in FIGS. 11 to 14, and thus, a detailed description thereof will be omitted.

As described above, according to various embodiments of the present invention, a trench of a predetermined depth is formed in a base substrate using an insulation layer and a metal layer is formed in the trench using a plating method such as an electroless plating method and an electrolysis plating method, so that a metal line having a sufficient thickness may be formed. Therefore, a sufficiently low resistance line may be easily realized.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A method for manufacturing an array substrate, the method comprising:

forming a gate line on a base substrate using an electroless plating method or an electrolysis plating method, the gate line including a first metal layer formed on the first seed layer;

forming a first insulation layer on the base substrate having the gate line;

forming a second seed layer on the base substrate having the first insulation layer in a direction crossing the gate line;

forming a second insulation layer on the base substrate having the second seed layer, the second insulation layer having a line trench formed through the second insulation layer to expose the second seed layer;

forming a second metal layer on the second seed layer of the line trench using the electroless plating method or the electrolysis plating method to form a data line including the second seed layer and the second metal layer; and forming a pixel electrode in a pixel area of the base substrate having the data line.

2. The method of claim 1, wherein the first insulation layer comprising an organic insulation layer having a low permittivity.

3. The method of claim 1, wherein forming the gate line comprises:

forming a photoresist pattern on the base substrate;

etching the base substrate through the photoresist pattern to form a trench;

forming a first seed metal layer on the base substrate having the trench formed thereon;

removing the photoresist pattern to have a first seed layer remained in the trench of the base substrate; and forming the first metal layer on the first seed layer formed in the trench of the base substrate using the electroless plating method or the electrolysis plating method.

4. The method of claim 1, wherein forming the second seed layer comprises:

forming a semiconductor layer, an ohmic contact layer and a second seed metal layer on the base substrate having the first insulation layer; and patterning the semiconductor layer, the ohmic contact layer and the second seed metal layer, simultaneously, to form a source electrode and a drain electrode of a switching element including the second seed layer, and a line pattern including the second seed layer.

5. The method of claim 4, wherein in the step of forming the second insulation layer including the line trench, a gate pad hole exposing an edge portion of the gate line is formed, and a data pad hole exposing a second seed layer of an edge portion of the data line is formed.

6. The method of claim 5, wherein in the step of forming the second metal layer, the second metal layer is formed in the gate pad hole and the data pad hole, respectively.

7. The method of claim 1, wherein the second insulation layer is an organic layer.

8. The method of claim 7, further comprising:

forming a light-blocking layer on the second insulation layer in correspondence with the gate line and the data line;

forming a color filter layer between the second insulation layer and the pixel electrode; and forming a capping layer on the light-blocking layer and the color filter layer.

9. The method of claim 1, wherein the second insulation layer and the color filter layer formed in the pixel area are formed from a same material.

10. The method of claim 9, further comprising forming a capping layer on the second insulation layer.

11. The method of claim 1, wherein forming a gate line comprises:
   forming a first seed layer that is patterned on the base substrate;
   forming an organic pattern having a trench surrounding the first seed layer; and
   forming the first metal layer on the first seed layer of the trench using the electroless plating method or the electrolysis plating method.

12. The method of claim 1, wherein forming a gate line comprises:
   forming an organic layer and a photoresist film on the base substrate;
   etching the organic layer and the photoresist film to form a photoresist pattern having a trench formed thereon;
   forming a first seed metal layer on the base substrate having the photoresist pattern;
   removing the photoresist pattern to have a first seed layer remained in the trench; and
   forming the first metal layer on the first seed layer of the trench using the electroless plating method or the electrolysis plating method.

* * * * *